(12) United States Patent
Miyoshi (10) Patent No.: US 7,199,408 B2
(45) Date of Patent: Apr. 3, 2007

(54) SEMICONDUCTOR MULTILAYER STRUCTURE, SEMICONDUCTOR DEVICE AND HEMT DEVICE

(75) Inventor: Makoto Miyoshi, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/151,693

(22) Filed: Jun. 13, 2005

(65) Prior Publication Data

US 2005/0274980 A1 Dec. 15, 2005

(30) Foreign Application Priority Data

Jun. 15, 2004 (JP) .............................. 2004-177042
May 18, 2005 (JP) .............................. 2005-145296

(51) Int. Cl.
*H01L 29/778* (2006.01)
(52) U.S. Cl. ............... 257/194; 257/192; 257/280; 257/284; 257/E29.246; 257/E29.247; 257/E29.249
(58) Field of Classification Search .................. None
See application file for complete search history.

(56) References Cited

U.S. PATENT DOCUMENTS

| 6,707,076 | B2 * | 3/2004 | Hori et al. ................. 257/194 |
| 2001/0002048 | A1 * | 5/2001 | Koike et al. ................ 257/80 |
| 2002/0167023 | A1 * | 11/2002 | Chavarkar et al. ........ 257/194 |
| 2005/0006639 | A1 * | 1/2005 | Dupuis et al. ............... 257/20 |

FOREIGN PATENT DOCUMENTS

JP 2004-22577 1/2004

OTHER PUBLICATIONS

Smorchkova, et al., "AlN/GaN and (Al,Ga)N/AlN/GaN two-dimensional electron gas structures grown by plasma-assisted molecular-beam epitaxy," Journal of Applied Physics, (Nov. 15, 2001) vol. 90, No. 10, pp. 5196-5201.
Shen, et al., "AlGaN/AlN/GaN High-Power Microwave HEMT," IEEE Electron Device Letters, (Oct. 2001) vol. 22, No. 10, pp. 457-459.

* cited by examiner

*Primary Examiner*—Minhloan Tran
*Assistant Examiner*—Eduardo A. Rodela
(74) *Attorney, Agent, or Firm*—Burr & Brown (57) ABSTRACT

A semiconductor device includes an underlying layer made of a group-III nitride containing at least Al and formed on a substrate, and a group of stacked semiconductor layers including a first semiconductor layer made of a group-III nitride, preferably GaN, a second semiconductor layer made of AlN and a third semiconductor layer made of a group-III nitride containing at least Al, preferably $Al_xGa_{1-x}N$ where $x \geq 0.2$. The semiconductor device suppresses the reduction in electron mobility resulting from lattice defects and crystal lattice randomness. This achieves a HEMT device having a sheet carrier density of not less than $1 \times 10^{13}/cm^2$ and an electron mobility of not less than 20000 $cm^2/V \cdot s$ at a temperature of 15 K.

19 Claims, 6 Drawing Sheets

|   |   | 15K | | 77K | | ROOM TEMPERATURE | |
|---|---|---|---|---|---|---|---|
|   |   | SHEET CARRIER DENSITY [×10$^{13}$/cm$^2$] | ELECTRON MOBILITY [cm$^2$/Vs] | SHEET CARRIER DENSITY [×10$^{13}$/cm$^2$] | ELECTRON MOBILITY [cm$^2$/Vs] | SHEET CARRIER DENSITY [×10$^{13}$/cm$^2$] | ELECTRON MOBILITY [cm$^2$/Vs] |
| (a) | INVENTIVE EXAMPLE | 0.95 | 25470 | 0.95 | 17570 | 0.95 | 2174 |
| (b) | COMPARATIVE EXAMPLE 1 | 0.92 | 8194 | 0.95 | 7408 | 0.97 | 1770 |
| (c) | COMPARATIVE EXAMPLE 2 | 0.94 | 5197 | 0.93 | 4896 | 0.92 | 1420 |
| (d) | COMPARATIVE EXAMPLE 3 | 0.92 | 3998 | 0.92 | 3980 | 0.90 | 1287 |

SEMICONDUCTOR MULTILAYER STRUCTURE, SEMICONDUCTOR DEVICE AND HEMT DEVICE

BACKGROUND OF THE INVENTION

1. Field of the Invention

The present invention relates to a HEMT (High Electron Mobility Transistor) employing a group-III nitride.

2. Description of the Background Art

Group-III nitride semiconductors including GaN, because of their large bandgap, high breakdown field strength and high melting point, have been expected as high-power, high-frequency and high-temperature semiconductor device materials alternative to GaAs-based materials. HEMTs (High Electron Mobility Transistors) and the like have been studied and developed as devices which take advantage of such physical properties. An example of the HEMTs having been studied and developed is a heterostructure HEMT including a substrate made of sapphire, SiC or the like, a GaN channel layer formed on the substrate, and a so-called electron supply layer of AlGaN or AlN formed on the channel layer.

In a HEMT as described above, a two-dimensional electron gas is formed at the surface of the channel layer by a piezoelectric effect such that an electric field extending from the surface to the substrate is formed and by a spontaneous polarization effect due to an (a-axis) lattice constant difference between the channel layer and the electron supply layer. The Al-richer the AlGaN layer is, the greater the lattice constant difference becomes, and the piezoelectric effect and the spontaneous polarization effect increase accordingly.

For increase in performance of the HEMT, there is a need to enhance electron mobility while maintaining a high carrier density (or sheet carrier density) at the surface of the channel layer. Attempts to satisfy the need by devising the structure of the HEMT device have been known. (See, for example, Japanese Patent Application Laid-Open No. 2004-22577; Smorchkova et al., "AlN/GaN and (Al,Ga)N/AlN/GaN two-dimensional electron gas structures grown by plasma-assisted molecular-beam epitaxy," Journal of Applied Physics, Volume 90, Number 10, pp. 5196–5201; Smorchkova et al., "AlGaN/AlN/GaN High-Power Microwave HEMT," IEEE Electron Device Letters, Vol. 22, No. 10, pp. 457–459.)

There are a variety of electron scattering mechanisms that influence the electron mobility for semiconductor. The electron scattering mechanisms are roughly classified into a mechanism based on lattice vibrations and a mechanism based on the randomness in arrangement of atoms. The former is caused by thermal energy, has a temperature dependence, and hardly contributes to the reduction in electron mobility at cryogenic temperatures. The latter, on the other hand, is caused by the presence of lattice defects and impurities, and differs from the former in that the influence of the randomness in arrangement of atoms still remains even at cryogenic temperatures. Thus, the enhancement in electron mobility at cryogenic temperatures means the reduction in the influence of the randomness in arrangement of atoms upon the electron mobility.

Japanese Patent Application Laid-Open No. 2004-22577 discloses a technique of providing a highly crystalline underlying layer containing AlN at an interface between a substrate and a GaN layer in a HEMT having an $Al_{0.26}Ga_{0.74}N$/GaN heterostructure to improve the crystallinity of a channel layer and an electron supply layer which are formed on the underlying layer, thereby increasing the performance of the HEMT. This technique achieves the HEMT having a sheet carrier density of $1 \times 10^{13}/cm^2$ or higher and an electron mobility of 8000 $cm^2/V \cdot s$ or higher at a temperature of 15 K.

The first article by Smorchkova et al., on the other hand, discloses a HEMT having an $Al_xGa_{1-x}N$/AlN/GaN structure in which an AlN layer is inserted at the interface of an AlGaN/GaN heterostructure for the purpose of avoiding alloy disorder scattering which is one of the scattering mechanisms resulting from the randomness in arrangement of atoms. This HEMT has a sheet carrier density of about $1.4 \times 10^{13}/cm^2$ or higher and an electron mobility of 4000 $cm^2/V \cdot s$ at a temperature of 17 K when x ranges from 0.25 to 0.45. Also, a HEMT having an $Al_xGa_{1-x}N$/GaN structure in which AlN is not inserted is achieved. This HEMT has an electron mobility exceeding 15000 $cm^2/V \cdot s$ when x is less than 0.2, in which case, however, the sheet carrier density is less than $5 \times 10^{12}/cm^2$.

SUMMARY OF THE INVENTION

The present invention is intended for a semiconductor device employing a group-III nitride, and a HEMT (High Electron Mobility Transistor) including the semiconductor device.

According to the present invention, the semiconductor device comprises: a predetermined base; an underlying layer formed on the base; and a group of semiconductor layers formed on the underlying layer and including a first semiconductor layer made of a first group-III nitride, a second semiconductor layer made of AlN which is a second group-III nitride, and a third semiconductor layer made of a third group-III nitride containing at least Al, the first, second and third semiconductor layers being stacked together in the order named as seen from the underlying layer side, the underlying layer being made of a fourth group-III nitride containing at least Al and having a higher Al mole fraction in all of the group-III elements than does the first group-III nitride, the semiconductor device having a sheet carrier density of not less than $5 \times 10^{12}/cm^2$ and an electron mobility of not less than 20000 $cm^2/V \cdot s$ at a temperature of 15 K.

This provides the semiconductor device having a good device characteristic, or a HEMT device including the semiconductor device. In particular, the attainment of the good device characteristic at cryogenic temperatures at which scattering factors have a little influence resulting from lattice vibrations achieves the provision of the semiconductor device and the like suppressing the reduction in electron mobility resulting from lattice defects and crystal lattice randomness.

Preferably, the underlying layer has a dislocation density of not greater than $1 \times 10^{11}/cm^2$.

The formation of the group of semiconductor layers over the underlying layer having such good crystal quality provides the good crystal quality of the group of semiconductor layers to achieve the semiconductor device having a high electron mobility.

More preferably, the fourth group-III nitride has an Al mole fraction of not less than 50 atom percent in all of the group-III elements.

The formation of the underlying layer made of such an Al-rich group-III nitride easily achieves the good crystal quality of the underlying layer.

It is therefore an object of the present invention to provide a semiconductor device and the like suppressing the reduction in electron mobility resulting from lattice defects and crystal lattice randomness and attaining a high electron mobility while maintaining a high sheet carrier density.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
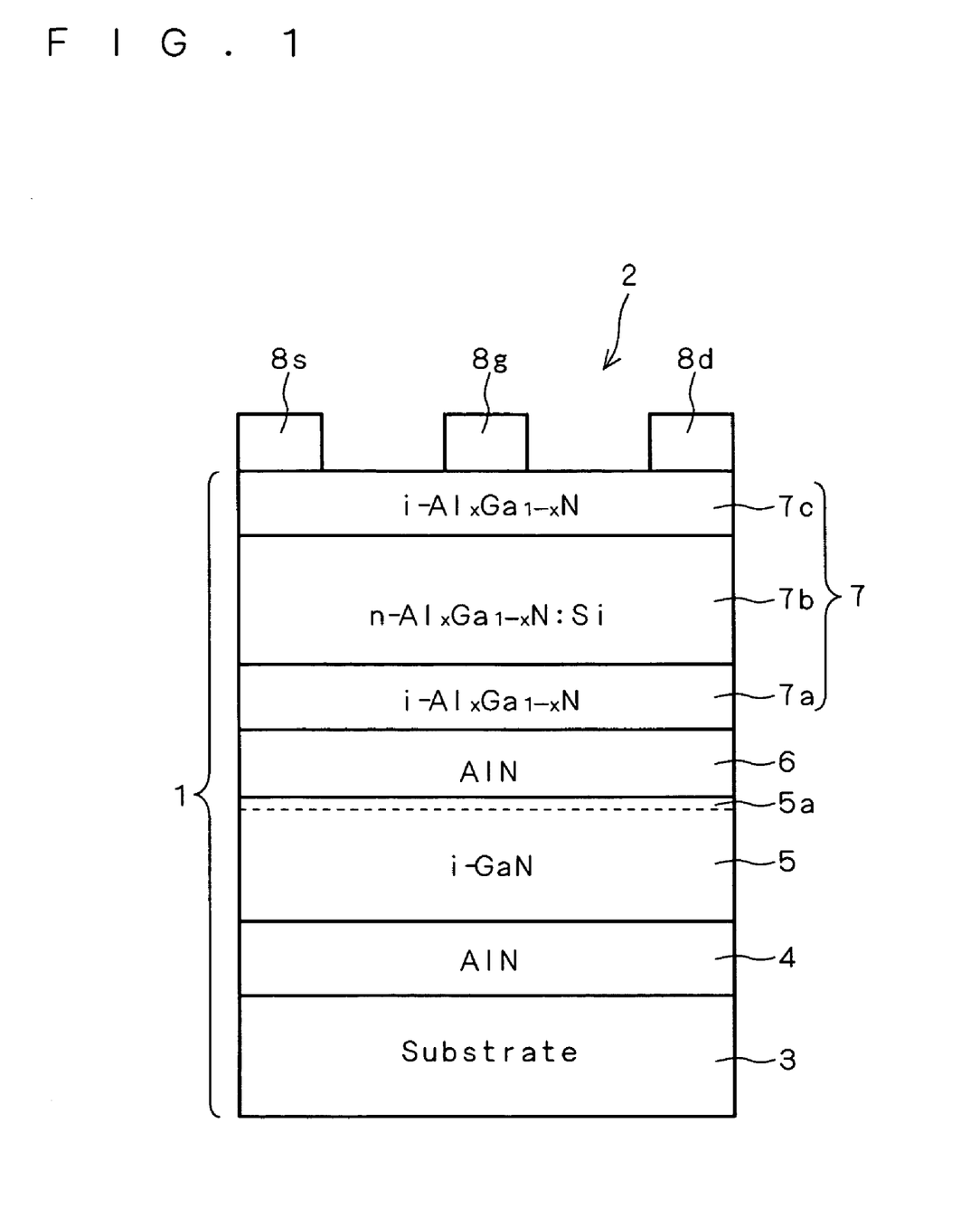
FIG. 1 is a schematic view showing the construction of a HEMT device formed by employing a semiconductor multilayer structure according to the present invention.

FIG. 1 is a schematic view showing the construction of a HEMT device 2 formed by employing a semiconductor multilayer structure 1 according to a preferred embodiment of the present invention. For purposes of illustration, the thicknesses of respective layers shown in FIG. 1 are not drawn to scale.

The semiconductor multilayer structure 1 includes an underlying layer 4, a first semiconductor layer 5, a second semiconductor layer 6 and a third semiconductor layer 7 which are formed on a substrate (base) 3. The first semiconductor layer 5, the second semiconductor layer 6 and the third semiconductor layer 7 are also generically referred to simply as semiconductor layers or a group of semiconductor layers hereinafter. The semiconductor multilayer structure 1 is also referred to hereinafter as an epitaxial substrate because the semiconductor multilayer structure 1 is formed by epitaxially growing the group of semiconductor layers on the substrate 3 and is provided for the subsequent device formation in a manner similar to a substrate, as will be described hereinbelow.

The HEMT device 2 includes a source electrode 8s, a drain electrode 8d and a gate electrode 8g which are formed on the semiconductor multilayer structure 1.

The material of the substrate 3 is appropriately selected in accordance with the composition and structure of the underlying layer 4 and semiconductor layers to be formed thereon or the technique of forming the layers. For example, a single crystal of SiC (silicon carbide) or sapphire cut to a predetermined thickness is used for the substrate 3. Alternatively, the material of the substrate 3 may be appropriately selected from the group consisting of: oxide materials such as ZnO, LiAlO$_2$, LiGaO$_2$, MgAl$_2$O$_4$, (LaSr)(AlTa)O$_3$, NdGaO$_3$ and MgO; group-IV single crystals such as Si and Ge; IV—IV compounds such as SiGe; III–V compounds such as GaAs, AlN, GaN and AlGaN; and single crystals of borides such as ZrB$_2$. Of such single crystals, an SiC substrate or a sapphire substrate is desirable. In particular, when a group-III nitride layer having a main surface coincident with the C plane thereof is provided as the underlying layer 4, it is desirable to use C-plane SiC or C-plane sapphire as the material of the substrate 3. This is because the use of such materials achieves the formation of the underlying layer 4 of high quality. When a group-III nitride layer having a main surface coincident with the A plane thereof is provided as the underlying layer 4, it is desirable to use A-plane SiC or R-plane sapphire as the material of the substrate 3. There are no special material limitations on the thickness of the substrate 3, but the substrate 3 having a thickness ranging from hundreds of micrometers to several millimeters are preferable for convenience of handling.

The underlying layer 4 is formed of a group-III nitride containing at least aluminum (Al) and having a higher Al mole fraction in all of the group-III elements than does the group-III nitride constituting the first semiconductor layer 5 (to be described later). Preferably, the underlying layer 4 is formed of a group-III nitride having an Al mole fraction in all of the group-III elements which is not less than 50 atom percent. More preferably, the underlying layer 4 is formed of a group-III nitride having an Al mole fraction in all of the group-III elements which is not less than 80 atom percent. Most preferably, the underlying layer 4 is formed of AlN. The underlying layer 4 is made of the group-III nitride of the above-mentioned composition because the threading dislocations from the underlying layer 4 are tangled with each other by the action of a substantially horizontal compressive stress produced near an interface portion of the first semiconductor layer 5 with the underlying layer 4 to consequently produce the effect of reducing the dislocations in the first semiconductor layer 5. The greater the difference in Al mole fraction between the underlying layer 4 and the first semiconductor layer 5 is, the greater the effect of reducing the dislocations is. This effect is maximized when the underlying layer 4 is made of AlN. It is, however, ascertained in experiments that the use of the group-III nitride having an Al mole fraction in all of the group-III elements which is not less than 80 atom percent as the material of the underlying layer 4 is as effective in reducing the dislocations as the use of AlN. The use of AlN as the material of the underlying layer 4 has another advantage that variations in composition do not present a problem. The underlying layer 4 is illustrated in FIG. 1 as made of AlN.

The underlying layer 4 thus formed typically takes on a hexagonal wurtzite structure. In particular, when a group-III nitride layer having a main surface coincident with the C plane thereof is used as the material of the underlying layer 4, the FWHM (full width at half maximum) for the (002) plane by X-ray rocking curve measurement (ω scan) for the underlying layer 4 is preferably not greater than 200 seconds, and more preferably not greater than 100 seconds. The attainment of such an FWHM means small fluctuations in growth orientation, aligned C planes and reduced dislocations of spiral components at the surface of the underlying layer 4. This is more preferable in forming the first semiconductor layer 5 of good crystal quality on the underlying layer 4. To achieve such crystallinity, it is not desirable to insert a so-called low-temperature buffer layer on the base 3. The lower limit of the FWHM for the (002) plane by the X-ray rocking curve measurement (ω scan) is not particularly determined, but does not fall below a theoretical value (10 seconds or lower) calculated from the material and crystal structure. It is desirable that the edge dislocation density in the underlying layer 4 be not greater than $5 \times 10^{10}$/cm$^2$. This condition can be achieved by forming a nitride layer on the surface of the substrate 3. Depending on the condition settings, the edge dislocation density as low as $1 \times 10^9$/cm$^2$ is attainable. In this preferred embodiment, the dislocation density is evaluated by using plan view TEM.

The underlying layer 4 preferably has a thickness ranging from 10 nm to 100 μm. The thickness lower than the above range is not preferable because insufficient crystal growth occurs in the underlying layer 4 and most of the many dislocations produced at the interface between the substrate 3 and the underlying layer 4 remain in the surface of the underlying layer 4. It is therefore desirable to form the underlying layer 4 having at least such a thickness that a dislocation density of not greater than $5 \times 10^{10}/cm^2$ is attained for the purpose of sufficiently eliminating the internal dislocations. The underlying layer 4 having a thickness of not less than 300 nm can attain a dislocation density of not greater than $5 \times 10^{10}/cm^2$ with stability. An excessive thickness, however, presents a disadvantage in costs and creates a likelihood that cracks are formed within the underlying layer 4. Thus, the thickness of the underlying layer 4 is appropriately defined within a range in which the formation of cracks is prevented. It is desirable that the thickness of the underlying layer 4 be not greater than 10 μm.

The underlying layer 4 may be formed, for example, by using an MOCVD process or an MBE (Molecular Beam Epitaxy) process. The MOCVD process may be used in combination with a PALE (Pulsed Atomic Layer Epitaxy) process, a plasma assisted process or a laser assisted process. The MBE process may also be used in combination with similar techniques. The growth methods such as the MOCVD process and the MBE process, which are capable of controlling the manufacturing conditions with high accuracy, are suitable for the growth of high-quality crystals. The use of such methods capable of setting reduced-pressure conditions at a heating temperature of 1100° C. to 1600° C. is desirable for the growth of the high-quality underlying layer 4 of AlN on a dissimilar base. More specific preparation conditions will be suitably selected and set in accordance with the above-mentioned growth techniques. Of these methods, it is especially desirable to use the MOCVD process which can achieve a state approaching a state of thermal equilibrium.

It is desirable that the topmost surface of the underlying layer 4 be substantially flat at the atomic level. In this case, the surface of the underlying layer 4 has such flatness that an atomic step is clearly observed, and the surface roughness (evaluated herein by using arithmetic mean roughness Ra in a 5- by 5-μm square region) of the topmost surface evaluated based on an AFM (Atomic Force Microscope) image is not greater than 0.5 nm which is approximately equal to the c-axis lattice constant of the group-III nitride material constituting the underlying layer 4, and preferably not greater than 0.3 nm. Few pits are observed at the surface when the value of the arithmetic mean roughness Ra is not greater than 0.3 nm.

To achieve such flatness of the surface of the underlying layer 4 at the atomic level, it is preferable to use a crystal growth technique which makes it difficult to cause variations in local unevenness. The MOCVD process in which a growth rate is several micrometers per hour at the most can be said to be preferred as the crystal growth technique. To form the underlying layer 4 as described above by the MOCVD process using trimethylaluminum and ammonia, it is desirable that the temperature of the substrate itself range from 1100° C. to 1250° C.; the pressure during the growth range from 5 Torr to 20 Torr; and a supply ratio between trimethylaluminum and ammonia be not greater than 1:500, more preferably not greater than 1:200.

The first semiconductor layer 5 is preferably formed of a high-resistance group-III nitride. More preferably, the first semiconductor layer 5 is formed of GaN (i-GaN) free of impurities which become a factor responsible for reductions in resistance. The first semiconductor layer 5 is illustrated in FIG. 1 as made of i-GaN. The first semiconductor layer 5 is also formed by a known deposition technique such as MOCVD and MBE processes. The first semiconductor layer 5 also has good crystal quality because the first semiconductor layer 5 is formed on the underlying layer 4 having high crystallinity as described above.

The higher the surface flatness of the underlying layer 4 is, the more effectively the above-mentioned dislocation reduction effect in the first semiconductor layer 5 is produced. The internal dislocation density of the first semiconductor layer 5 can be not greater than one-half the dislocation density of at least the surface portion of the underlying layer 4, and can be reduced to $5 \times 10^7/cm^2$. The formation of the first semiconductor layer 5 on the underlying layer 4 flat to such a degree that few pits exist on the surface improves the surface flatness of the third semiconductor layer 7 in addition to being able to suppress the occurrence of a situation such that crystal defects are induced by the pits in the first semiconductor layer 5.

A two-dimensional electron gas region 5a produced by a high-concentration two-dimensional electron gas is formed near the upper surface of the first semiconductor layer 5 by supplying electrons serving as carriers from the third semiconductor layer 7. For this reason, the first semiconductor layer 5 is required to have a thickness large enough to ensure the two-dimensional electron gas region 5a. It is, however, preferable to form the first semiconductor layer 5 having a thickness of about several micrometers because an excessive thickness is prone to cause cracks.

The second semiconductor layer 6 is formed of AlN. The second semiconductor layer 6 preferably has a thickness of not greater than 5 nm. When the thickness of the second semiconductor layer 6 is 1 nm, a sheet carrier density of $0.95 \times 10^{13}/cm^2$ and an electron mobility of 2174 $cm^2/V \cdot s$ are attained at room temperature as shown in the row (a) of FIG. 3. When the thickness of the second semiconductor layer 6 is 0.5 nm, on the other hand, the result is an electron mobility of 1790 $cm^2/V \cdot s$ for a sheet carrier density of $0.95 \times 10^{13}/cm^2$ at room temperature. Considering these results, it is more preferable to form the second semiconductor layer 6 having a thickness ranging from 0.5 nm to 1.5 nm from the viewpoint of characteristics. The increased thickness of the second semiconductor layer 6 presents a problem in that cracks are prone to occur due to a lattice constant difference between the first semiconductor layer 5 and the second semiconductor layer 6.

The third semiconductor layer 7 is formed of a group-III nitride containing at least Al. Preferably, the third semiconductor layer 7 is formed of a group-III nitride having an $Al_xGa_{1-x}N$ composition so that the bandgap of the third semiconductor layer 7 is greater than the bandgap of the first semiconductor layer 5. Preferably, the third semiconductor layer 7 has a total thickness ranging from 20 nm to 30 nm in terms of the formation of the two-dimensional electron gas region 5a and the device operation (i.e., the controllability of a main current for gate voltage application).

The third semiconductor layer 7 is formed by a known deposition technique such as MOCVD and MBE processes. The formation of the third semiconductor layer 7 made of a group-III nitride having a higher value of x or an Al-richer group-III nitride produces the greater piezoelectric effect to improve the sheet carrier density in the two-dimensional electron gas region 5a. Preferably, the third semiconductor layer 7 is formed of a group-III nitride which satisfies $x \geq 0.2$. It is, however, necessary to select a growth condition which causes no cracks because the increased value of x is prone to cause cracks.

Referring to FIG. 1, the third semiconductor layer 7 is shown as including three layers: a lower layer 7a, an intermediate layer 7b doped with Si as an n-type dopant, and an upper layer 7c. The intermediate layer 7b may be doped with an element other than Si instead of Si. In the instance shown in FIG. 1, the intermediate layer 7b functions as a so-called electron supply layer. The lower layer 7a functions as a so-called barrier layer, and the upper layer 7c functions as a so-called capping layer. The configuration of the third semiconductor layer 7 is not limited to that shown in FIG. 1 if at least the function as the electron supply layer is performed. For example, a single electron supply layer may be provided as the third semiconductor layer 7. Further, the third semiconductor layer 7 need not be doped with an n-type dopant.

Figure 2A:
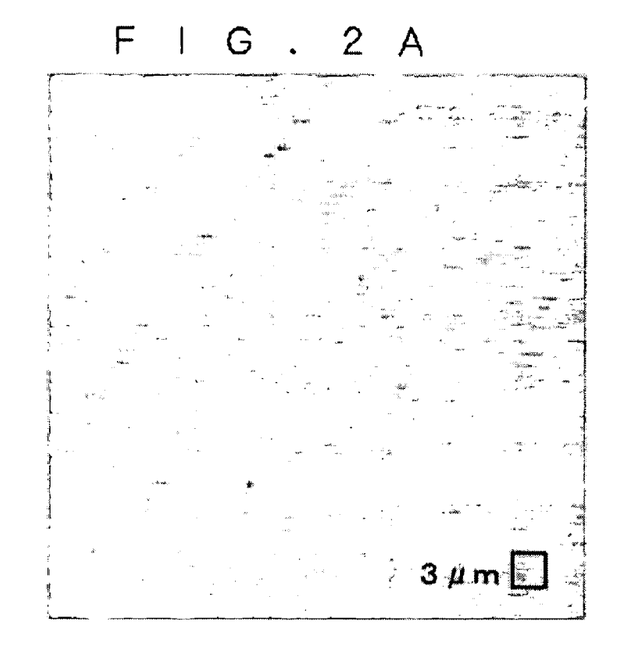
FIGS. 2A and 2B show AFM images of the surface of the semiconductor multilayer structure.
Figure 2B:
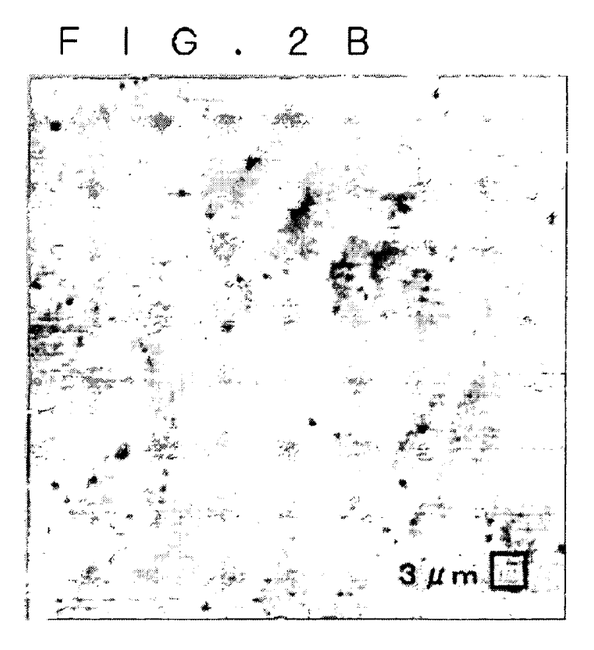

The third semiconductor layer 7 is preferably formed so that the X-ray rocking curve FWHM for the (002) plane is not greater than 250 seconds, and is also formed so that the pit density at the surface thereof is not greater than $5 \times 10^8/\text{cm}^2$. FIG. 2A illustrates an AFM image of the surface of the semiconductor multilayer structure 1, that is, the surface of the third semiconductor layer 7. FIG. 2B illustrates an AFM image of the surface of a semiconductor multilayer structure which does not include the underlying layer 4 for comparison. The former can be said to show fewer pits observed than the latter. Such good crystallinity of the third semiconductor layer 7 is by virtue of the appropriate control of the growth conditions of the semiconductor layers depending on the deposition technique to be used in addition to the provision of the underlying layer 4 having the above-mentioned high crystallinity.

The source electrode 8s and the drain electrode 8d are formed on the surface of the third semiconductor layer 7 (or the upper layer 7c), for example, by Ti/Au/Ni/Au ohmic contact. The source electrode 8s and the drain electrode 8d may be formed after a predetermined process for the contact is performed on future electrode portions of the surface of the third semiconductor layer 7. The gate electrode 8g is formed on the surface of the third semiconductor layer 7 (or the upper layer 7c), for example, by Pd/Ti/Au Schottky contact.

In the HEMT device 2 having such a construction, the two-dimensional electron gas is formed in the surface of the first semiconductor layer 5 by a piezoelectric effect which forms an electric field extending from the surface to the substrate and a spontaneous polarization effect due to a lattice constant difference between the first semiconductor layer 5 and the second and third semiconductor layers 6, 7. The first semiconductor layer 5 is made of GaN free of impurities, and the second semiconductor layer 6 is made of AlN, rather than mixed crystal. This prevents alloy scattering at the heterointerface between the first semiconductor layer 5 and the second semiconductor layer 6 to improve the electron mobility.

For example, a sheet carrier density of not less than $5 \times 10^{12}/\text{cm}^2$ and an electron mobility of not less than 20000 $\text{cm}^2/\text{V}\cdot\text{s}$ at a temperature of 15 K are attained in the HEMT device 2 including the third semiconductor layer 7 made of a group-III nitride having an $Al_xGa_{1-x}N$ structure where $x \geq 0.2$.

Japanese Patent Application Laid-Open No. 2004-22577 discloses a HEMT device which includes an electron supply layer having an $Al_{0.26}Ga_{0.74}N$ composition but does not include a layer corresponding to the second semiconductor layer 6. This HEMT device has a sheet carrier density of $1.0 \times 10^{13}/\text{cm}^2$ but has an electron mobility of only 8500 $\text{cm}^2/\text{V}\cdot\text{s}$ at a temperature of 15 K.

The first article by Smorchkova et al. discloses a HEMT device which includes a layer corresponding to the third semiconductor layer 7 made of a group-III nitride having an $Al_xGa_{1-x}N$ structure where x is greater than 0.25 but does not include a layer corresponding to the underlying layer 4. This article does not disclose the characteristic values of the HEMT device at a temperature of 15 K, but discloses the characteristic values at a temperature of 17 K instead. This HEMT device has a sheet carrier density of $1.0 \times 10^{13}/\text{cm}^2$ but has an electron mobility of only 6000 $\text{cm}^2/\text{V}\cdot\text{s}$ at a temperature of 17 K. This article further discloses the characteristic values of a second HEMT device which also does not include a layer corresponding to the second semiconductor layer 6 at a temperature of 17 K. The second HEMT device achieves a high sheet carrier density when the compositional limit of the electron supply layer is $x \geq 0.1$. The second HEMT device, however, has an electron mobility of only 4000 $\text{cm}^2/\text{V}\cdot\text{s}$ although the sheet carrier density is not less than $1.0 \times 10^{13}/\text{cm}^2$ when the compositional limit is $x \geq 0.2$.

The HEMT device 2 according to this preferred embodiment, on the other hand, attains a high electron mobility while having a high sheet carrier density as described above even when the HEMT device 2 include the third semiconductor layer 7 having an $Al_xGa_{1-x}N$ composition where $x \geq 0.2$. Such high values of the sheet carrier density and electron mobility far exceed the values easily anticipated from the techniques disclosed in Japanese Patent Application Laid-Open No. 2004-22577 and the first article by Smorchkova et al. This preferred embodiment provides the second semiconductor layer 6 between the first semiconductor layer 5 functioning as a channel layer and the third semiconductor layer 7 functioning as the electron supply layer in addition to providing the underlying layer 4 having high crystallinity to improve the crystallinity of the second and third semiconductor layers 6 and 7, from which an inference will be made that this preferred embodiment more effectively suppresses the reduction in electron mobility based on the randomness in arrangement of atoms. The above-mentioned very good characteristics are considered to be attained at a temperature of 15 K at which this effect is remarkable.

Further, the HEMT device 2 including the above-mentioned third semiconductor layer 7 made of the group-III nitride having the $Al_xGa_{1-x}N$ structure where $x \geq 0.2$ attains a sheet carrier density of not less than $5 \times 10^{12}/\text{cm}^2$ and an electron mobility of not less than 15000 $\text{cm}^2/\text{V}\cdot\text{s}$ at a temperature of 77 K, and attains a sheet carrier density of not less than $5 \times 10^{12}/\text{cm}^2$ and an electron mobility of not less than 1900 $\text{cm}^2/\text{V}\cdot\text{s}$ at room temperature. Additionally, the transconductance of the HEMT device 2 at room temperature is not less than 150 mS/mm. It can be said that sufficiently increased performance is accomplished in such temperature ranges.

As described hereinabove, the HEMT device 2 according to this preferred embodiment includes the underlying layer 4 made of the group-III nitride containing at least Al and formed on the substrate 3, and the group of stacked semiconductor layers including the first semiconductor layer 5 made of the group-III nitride, preferably GaN, the second semiconductor layer 6 made of AlN and the third semiconductor layer 7 made of the group-III nitride containing at least Al, preferably $Al_xGa_{1-x}N$ where $x \geq 0.2$. This suppresses the reduction electron mobility resulting from lattice defects and crystal lattice randomness to attain a high electron mobility while maintaining a high sheet carrier density.

<Modifications>

Figure 4:
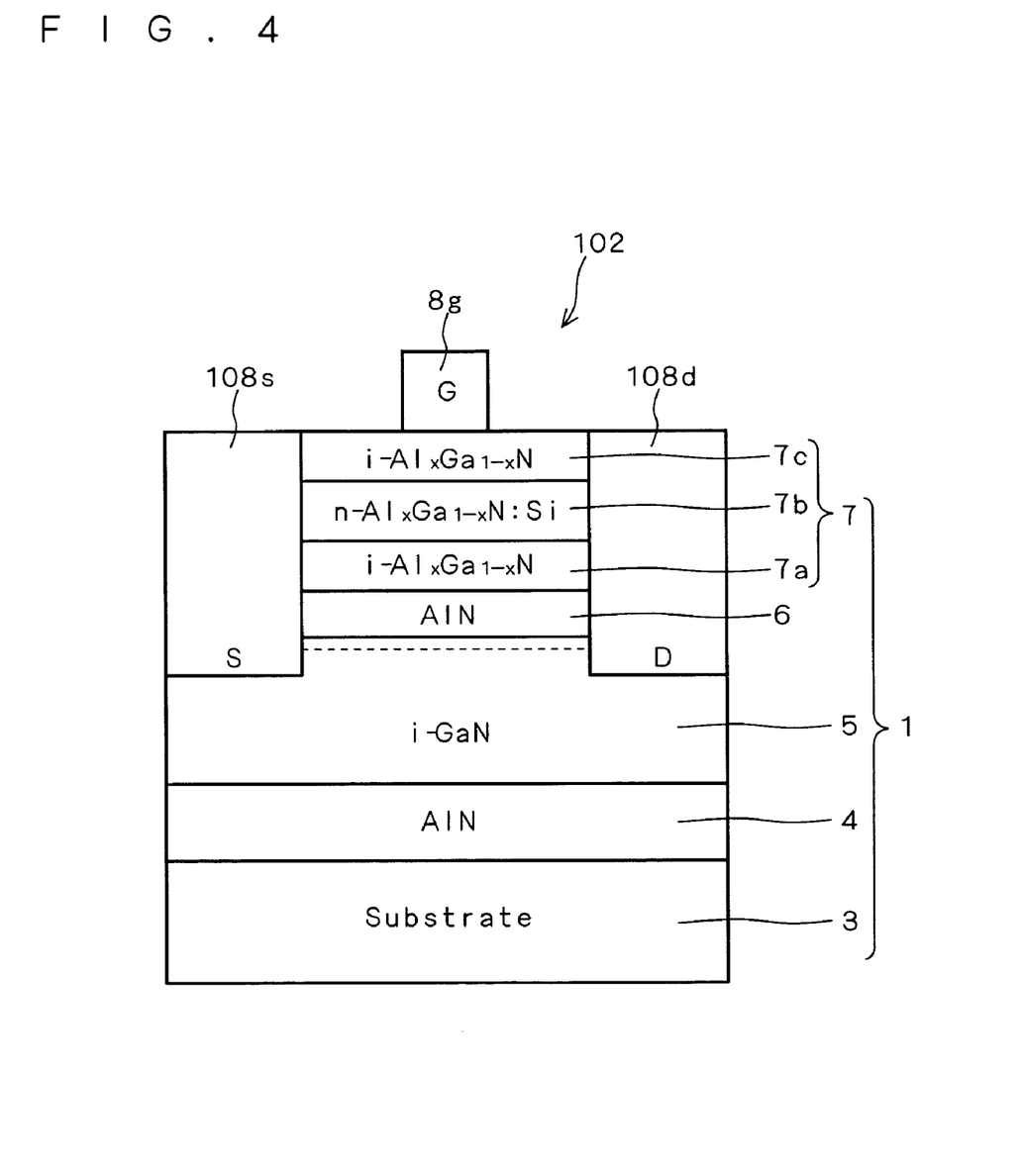
FIGS. 4 through 6 are schematic views showing the constructions of HEMT devices according to modifications of the present invention.
Figure 5:
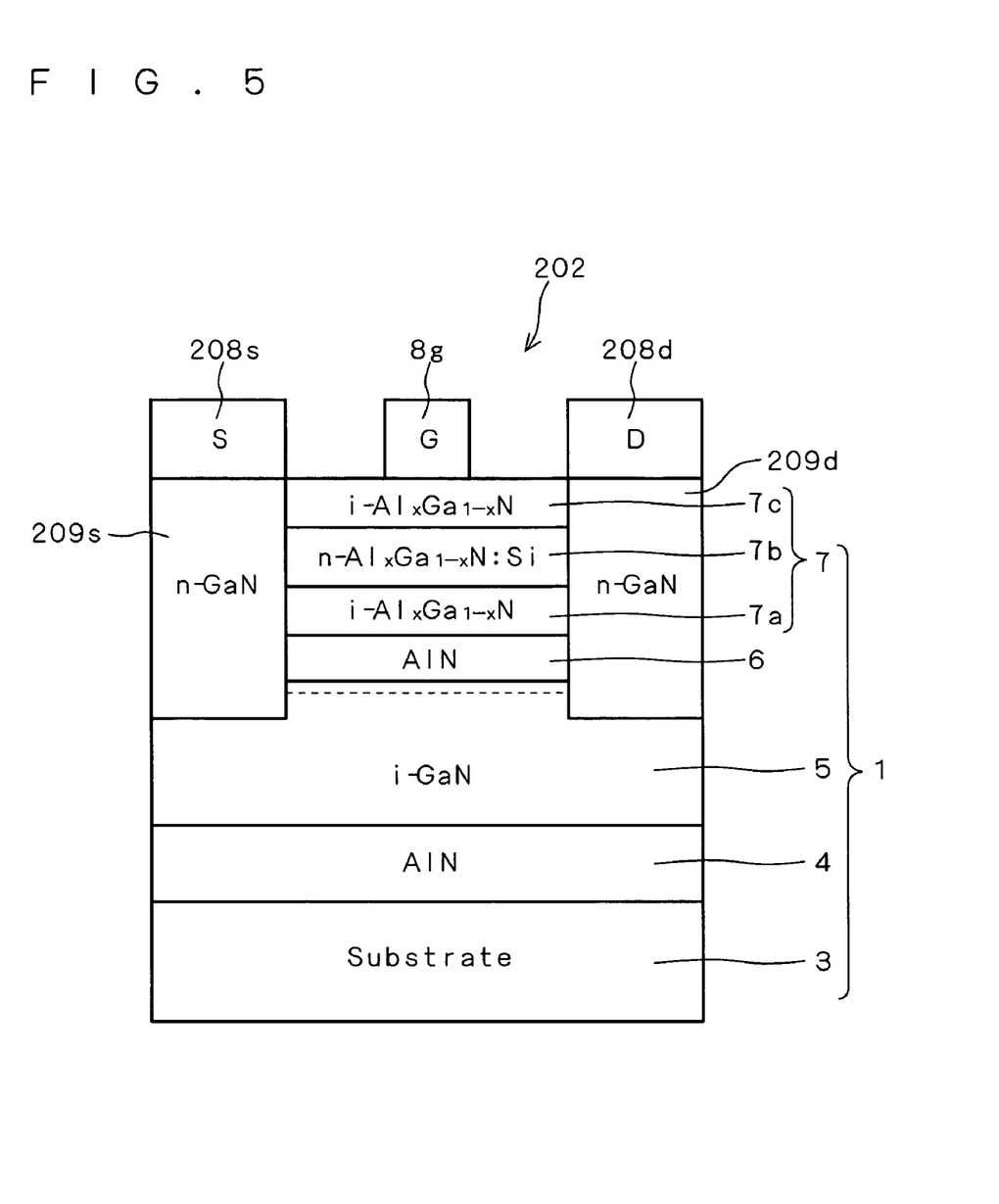
Figure 6:
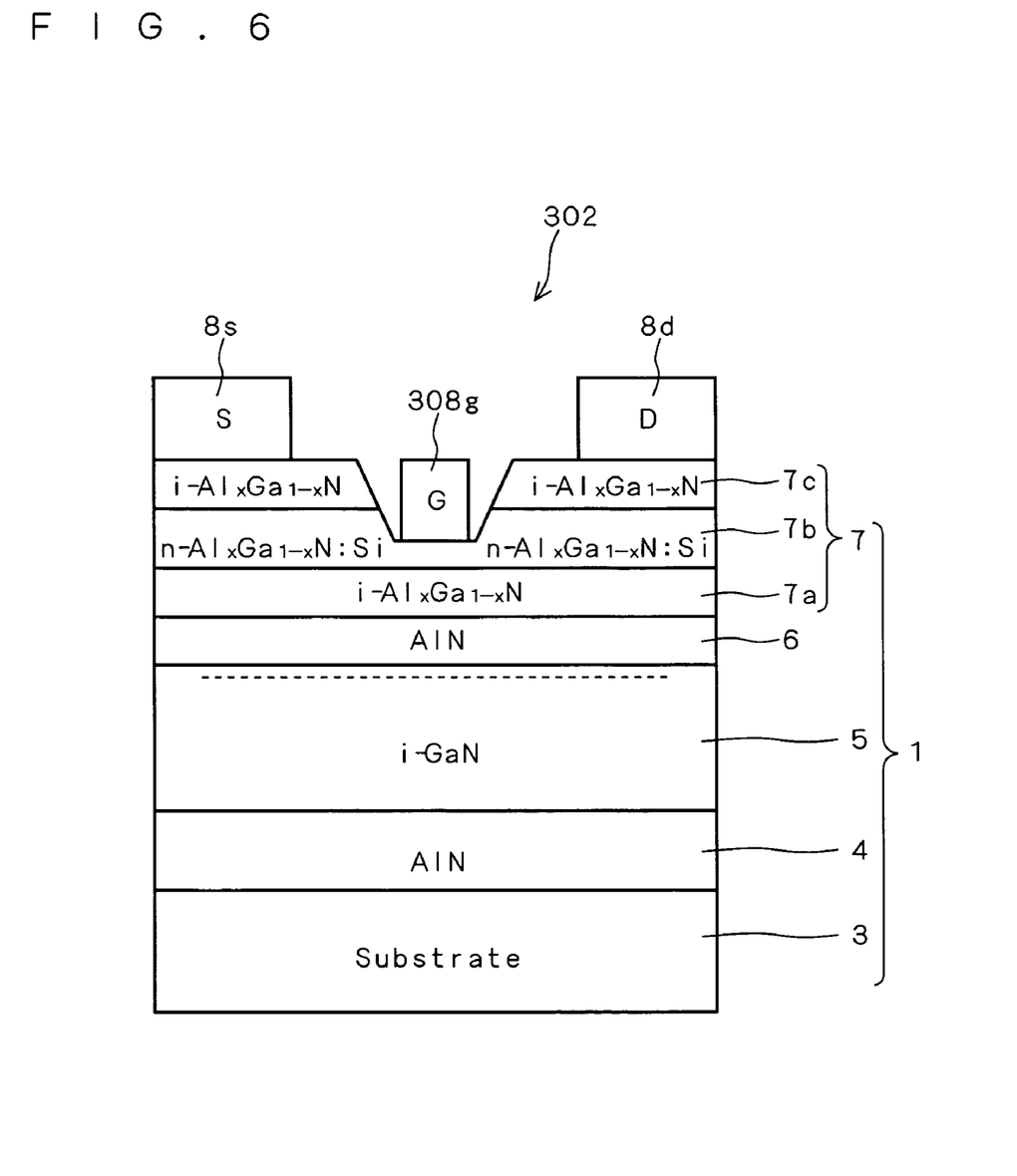

The structure of the HEMT device is not limited to that described in the above-mentioned preferred embodiment, but the HEMT device may be of a variety of structures. FIGS. 4 through 6 are views showing HEMT devices having structures different from the above-mentioned structure which are prepared using the semiconductor multilayer structure 1 of the preferred embodiment.

FIG. 4 is a view of a HEMT device 102. A process for manufacturing the HEMT device 102 includes etching a portion of the semiconductor multilayer structure 1, for example, by reactive ion etching (RIE) to expose a portion of the first semiconductor layer 5, and then forming a source electrode 108s and a drain electrode 108d.

FIG. 5 is a view of a HEMT device 202. A process for manufacturing the HEMT device 202 includes similarly etching a portion of the semiconductor multilayer structure 1 to expose a portion of the first semiconductor layer 5, providing contact layers 209s and 209d by the selective regrowth of Si-doped GaN, and forming a source electrode 208s and a drain electrode 208d on top of the contact layers 209s and 209d, respectively.

FIG. 6 is a view of a HEMT device 302. The HEMT device 302 includes a tapered groove in a portion (reaching the intermediate layer 7b) of the third semiconductor layer 7 of the semiconductor multilayer structure 1, and a gate electrode 308g on the bottom surface of the tapered groove.

The HEMT devices having such structures also attain a high electron mobility while maintaining a high sheet carrier density as in the above-mentioned preferred embodiment.

EXAMPLES (Inventive Example)

In Inventive Example, the semiconductor multilayer structure 1 in the above-mentioned preferred embodiment and the HEMT device 2 employing the semiconductor multilayer structure 1 were prepared. For the preparation of the semiconductor multilayer structure 1, a C-plane sapphire single crystal having a diameter of 4 inches and a thickness of 630 μm was used for the substrate 3, and was placed in a tubular reactor of a predetermined MOCVD apparatus. The MOCVD apparatus can supply the tubular reactor with a reaction gas or a carrier gas at least selected from the group consisting of $H_2$, $N_2$, TMG (trimethylgallium), TMA (trimethylaluminum), $NH_3$, and silane gas. While a carrier gas of hydrogen flowed at a flow rate of 3 m/sec and the pressure within the tubular reactor was maintained at 20 Torr, the temperature of the substrate 3 was raised up to 1200° C. and thereafter held at 1200° C. for ten minutes. Thus, thermal cleaning was performed on the substrate 3.

Thereafter, while the substrate temperature was held at 1200° C., TMA and hydrogen serving as a TMA carrier gas were supplied, and $NH_3$ and hydrogen serving as an $NH_3$ carrier gas were supplied to grow an AlN layer having a thickness of 1 μm and functioning as the underlying layer 4. In this process step, the flow rates of TMA and $NH_3$ were controlled so that the supply molar ratio therebetween satisfied TMA:$NH_3$=1:450. The X-ray rocking curve FWHM for the (002) plane of the underlying layer 4 thus obtained was 60 seconds. The underlying layer 4 thus obtained also had a dislocation density of $1\times10^{10}/cm^2$ and a surface roughness Ra of 0.15 nm.

Subsequently, after the temperature and the pressure were changed to and held at 1100° C. and 760 Torr respectively, TMG and $NH_3$ were supplied so that the supply molar ratio therebetween satisfied TMG:$NH_3$=1:2000 to form a GaN layer having a thickness of 2 μm and functioning as the first semiconductor layer 5. In this process step, the amounts of supply of TMG and $NH_3$ were set so that the deposition rate was about 3 μm/hr.

After the formation of the GaN layer, the temperature was changed to 1080° C. Then, TMA and $NH_3$ were supplied to form an AlN layer having a thickness of 1 nm and functioning as the second semiconductor layer 6. In this process step, TMA and $NH_3$ were supplied so that the supply molar ratio therebetween satisfied TMA:$NH_3$=1:450.

After the formation of the AlN layer, the temperature was changed to and held at 1080° C. Then, TMA, TMG and $NH_3$ were supplied so that the supply molar ratio therebetween satisfied TMA:TMG:$NH_3$=0.2:0.7:2000 to form the third semiconductor layer 7 having an $Al_{0.26}Ga_{0.74}N$ composition. In the course of this process step, a silane gas was further supplied to dope the third semiconductor layer 7 with Si as an n-type dopant. This formed the lower layer 7a, the Si-doped intermediate layer 7b, and the upper layer 7c having thicknesses of 7 nm, 15 nm and 3 nm, respectively. The above-mentioned process steps provided the semiconductor multilayer structure 1.

The image shown in FIG. 2A was obtained by the AFM observation of the surface of the semiconductor multilayer structure 1 thus obtained, that is, the surface of the third semiconductor layer 7. It is recognized from FIG. 2A that good atomic steps are formed and no cracks are formed in the surface. The pit density at the surface at this time was $5\times10^8/cm^2$. The X-ray rocking curve FWHMs for the (002) plane and for the (102) plane were 203 seconds and 370 seconds, respectively. It was recognized from these facts that the semiconductor multilayer structure 1 had good surface quality.

The Ti/Au/Ni/Au source and drain electrodes 8s and 8d were formed by ohmic contact in predetermined positions of the surface of the semiconductor multilayer structure 1, and the Pd/Ti/Au gate electrode 8g was formed by Schottky contact, whereby the HEMT device 2 was obtained.

Figure 3:
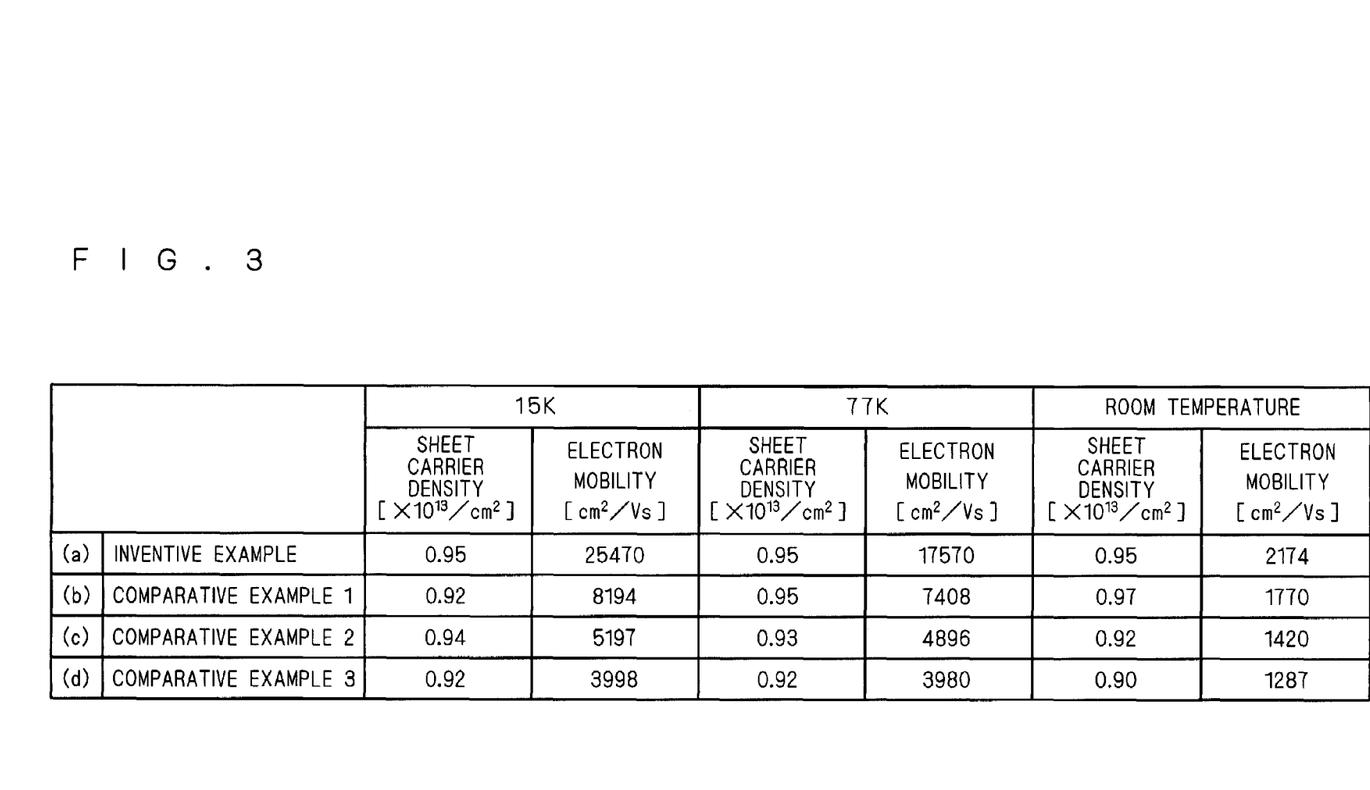
FIG. 3 shows a table providing a listing of values of a sheet carrier density and an electron mobility for HEMT devices in Inventive Example and Comparative Examples.

Results of measurement of the sheet carrier density and the electron mobility for the HEMT device 2 thus obtained at a temperature of 15 K, at a temperature of 77K and at room temperature are shown in the row (a) of FIG. 3. In particular, a high electron mobility exceeding 25000 $cm^2$/V·s is attained at the temperature of 15 K while a sheet carrier density close to $1.0\times10^{13}/cm^2$ is maintained. The transconductance was 160 mS/mm at room temperature when the gate length was 2 μm.

Comparative Example 1

A HEMT device identical in semiconductor multilayer structure with the HEMT device 2 of Inventive Example except for the absence of the underlying layer 4 was prepared as Comparative Example 1.

The image shown in FIG. 2B was obtained by the AFM observation of the surface of the semiconductor multilayer structure thus obtained, that is, the surface of the third semiconductor layer. Black spots indicating pits are found everywhere in the image of FIG. 2B, and it is recognized that the unevenness of the surface in FIG. 2B is greater than that in Inventive Example shown in FIG. 2A. The pit density at the surface at this time was about $2\times10^{10}/cm^2$. The X-ray rocking curve FWHMs for the (002) plane and for the (102) plane were 319 seconds and 795 seconds, respectively. It is therefore understood that the semiconductor multilayer structure in Comparative Example 1 is inferior in crystallinity to that in Inventive Example.

Results of measurement of the sheet carrier density and the electron mobility for the HEMT device thus obtained at a temperature of 15 K, at a temperature of 77K and at room temperature are shown in the row (b) of FIG. 3. At the temperature of 15 K, the sheet carrier density of Comparative Example 1 was comparable to that of Inventive Example, but the electron mobility of Comparative Example 1 was only 8000 cm$^2$/V·s. The transconductance was 130 mS/mm at room temperature when the gate length was 2 μm.

Comparative Example 2

A HEMT device identical in semiconductor multilayer structure with the HEMT device 2 of Inventive Example except for the absence of the second semiconductor layer 6 was prepared as Comparative Example 2.

Results of measurement of the sheet carrier density and the electron mobility for the HEMT device thus obtained at a temperature of 15 K, at a temperature of 77K and at room temperature are shown in the row (c) of FIG. 3. At the temperature of 15 K, the sheet carrier density of Comparative Example 2 was comparable to that of Inventive Example, but the electron mobility of Comparative Example 2 was only 5000 cm$^2$/V·s. The transconductance was 130 mS/mm at room temperature when the gate length was 2 μm.

Comparative Example 3

A HEMT device identical in semiconductor multilayer structure with the HEMT device of Inventive Example except for the absence of the underlying layer 4 and the second semiconductor layer 6 was prepared as Comparative Example 3.

Results of measurement of the sheet carrier density and the electron mobility for the HEMT device thus obtained at a temperature of 15 K, at a temperature of 77K and at room temperature are shown in the row (d) of FIG. 3. At the temperature of 15 K, the sheet carrier density of Comparative Example 3 was comparable to that of Inventive Example, but the electron mobility of Comparative Example 3 was only 4000 cm$^2$/V·s. The transconductance was 120 mS/mm at room temperature when the gate length was 2 μm.

It will be found from Inventive Example and Comparative Examples 1 to 3 described above that the HEMT device according to the preferred embodiment attains a high electron mobility while having a high sheet carrier density even when the HEMT device includes an electron supply layer having an Al$_x$Ga$_{1-x}$N composition where x≧0.2, and in particular has a more remarkably excellent characteristic which is not less than three times that of Comparative Examples at a temperature of 15 K.

While the invention has been described in detail, the foregoing description is in all aspects illustrative and not restrictive. It is understood that numerous other modifications and variations can be devised without departing from the scope of the invention.

What is claimed is:

1. A semiconductor multilayer structure comprising:
    a predetermined base;
    an underlying layer formed on said base; and
    a group of semiconductor layers formed on said underlying layer and including
        a first semiconductor layer made of a first group-III nitride,
        a second semiconductor layer made of AlN which is a second group-III nitride, and
        a third semiconductor layer made of a third group-III nitride containing at least Al,
    said first, second and third semiconductor layers being stacked together in the order named as seen from the underlying layer side,
    said underlying layer being made of a fourth group-III nitride containing at least Al and having a higher Al mole fraction in all of the group-III elements than does said first group-III nitride,
    said semiconductor multilayer structure having a sheet carrier density of not less than 5×10$^{12}$/cm$^2$ and an electron mobility of not less than 20000 cm$^2$/V·s at a temperature of 15 K.

2. A semiconductor device comprising:
    a predetermined base;
    an underlying layer formed on said base; and
    a group of semiconductor layers formed on said underlying layer and including
        a first semiconductor layer made of a first group-III nitride,
        a second semiconductor layer made of AlN which is a second group-III nitride, and
        a third semiconductor layer made of a third group-III nitride containing at least Al,
    said first, second and third semiconductor layers being stacked together in the order named as seen from the underlying layer side,
    said underlying layer being made of a fourth group-III nitride containing at least Al and having a higher Al mole fraction in all of the group-III elements than does said first group-III nitride,
    said semiconductor device having a sheet carrier density of not less than 5×10$^{12}$/cm$^2$ and an electron mobility of not less than 20000 cm$^2$/V·s at a temperature of 15 K.

3. The semiconductor device according to claim 2,
    said semiconductor device having a sheet carrier density of not less than 5×10$^{12}$/cm$^2$ and an electron mobility of not less than 15000 cm$^2$/V·s at a temperature of 77 K.

4. The semiconductor device according to claim 3,
    said semiconductor device having a sheet carrier density of not less than 5×10$^{12}$/cm$^2$ and an electron mobility of not less than 1900 cm$^2$/V·s at room temperature.

5. The semiconductor device according to claim 2, wherein
    said third group-III nitride has an Al mole fraction of not less than 20 atom percent relative to all of the group-III elements in said third group-III nitride.

6. The semiconductor device according to claim 2, wherein
    said underlying layer has a dislocation density of not greater than 1×10$^{11}$/cm$^2$.

7. The semiconductor device according to claim 6, wherein
    a rocking curve FWHM for a (002) plane of said third semiconductor layer is not greater than 250 seconds.

8. The semiconductor device according to claim 6, wherein
    a pit density at a surface of said third semiconductor layer is not greater than 5×10$^8$/cm$^2$.

9. The semiconductor device according to claim 6, wherein
    said fourth group-III nitride has an Al mole fraction of not less than 50 atom percent in all of the group-III elements.

10. The semiconductor device according to claim 9, wherein
    said fourth group-III nitride is AlN.

11. The semiconductor device according to claim 2, wherein
said second semiconductor layer has a thickness ranging from 0.5 nm to 1.5 nm.

12. The semiconductor device according to claim 2, wherein
the bandgap of said third semiconductor layer is greater than that of said first semiconductor layer.

13. The semiconductor device according to claim 2, wherein
said first group-III nitride is GaN.

14. The semiconductor device according to claim 2, wherein
said third group-III nitride is a mixed crystal of AlN and GaN.

15. The semiconductor device according to claim 2,
said semiconductor device having a transconductance of not less than 150 mS/mm at room temperature.

16. A HEMT device comprising a semiconductor device, said semiconductor device comprising:
a predetermined base;
an underlying layer formed on said base; and
a group of semiconductor layers formed on said underlying layer and including
a first semiconductor layer made of a first group-III nitride,
a second semiconductor layer made of AlN which is a second group-III nitride, and
a third semiconductor layer made of a third group-III nitride containing at least Al,
said first, second and third semiconductor layers being stacked together in the order named as seen from the underlying layer side,
said underlying layer being made of a fourth group-III nitride containing at least Al and having a higher Al mole fraction in all of the group-III elements than does said first group-III nitride,
said semiconductor device having a sheet carrier density of not less than $5 \times 10^{12}/cm^2$ and an electron mobility of not less than 20000 $cm^2/V \cdot s$ at a temperature of 15 K.

17. The semiconductor multilayer structure according to claim 1, wherein
a surface roughness of said underlying layer evaluated by using arithmetic mean roughness Ra is not greater than 0.5 nm.

18. The semiconductor device according to claim 2, wherein
a surface roughness of said underlying layer evaluated by using arithmetic mean roughness Ra is not greater than 0.5 nm.

19. The HEMT device according to claim 16, wherein
a surface roughness of said underlying layer evaluated by using arithmetic mean roughness Ra is not greater than 0.5 nm.

* * * * *